(12) United States Patent
Cortez et al.

(10) Patent No.: US 8,968,438 B2
(45) Date of Patent: Mar. 3, 2015

(54) METHODS AND APPARATUS FOR THE IN SITU COLLECTION OF NUCLEATED PARTICLES

(75) Inventors: Raul Cortez, San Jose, CA (US);
Xuegeng Li, Sunnyvale, CA (US);
Christopher Alcantara, San Jose, CA (US); Karel Vanheusden, Los Altos, CA (US)

(73) Assignee: Innovalight, Inc., Sunnyvale, CA (US)

( * ) Notice: Subject to any disclaimer, the term of this patent is extended or adjusted under 35 U.S.C. 154(b) by 414 days.

(21) Appl. No.: 12/424,277

(22) Filed: Apr. 15, 2009

(65) Prior Publication Data
US 2009/0255222 A1 Oct. 15, 2009

Related U.S. Application Data

(63) Continuation-in-part of application No. 11/775,509, filed on Jul. 10, 2007.

(51) Int. Cl.
| B22F 9/14 | (2006.01) |
| B01J 19/08 | (2006.01) |
| B82Y 15/00 | (2011.01) |
| B82Y 30/00 | (2011.01) |
| C01B 33/029 | (2006.01) |
| H01J 37/32 | (2006.01) |

(52) U.S. Cl.
CPC .............. *B01J 19/088* (2013.01); *B82Y 15/00* (2013.01); *B82Y 30/00* (2013.01); *C01B 33/029* (2013.01); *H01J 37/32541* (2013.01); *H01J 37/32568* (2013.01); *B01J 2219/0809* (2013.01); *B01J 2219/083* (2013.01); *B01J 2219/0841* (2013.01); *B01J 2219/0869* (2013.01); *B01J 2219/0875* (2013.01); *B01J 2219/0883* (2013.01); *B01J 2219/0894* (2013.01); *H01J 2237/022* (2013.01)
USPC ........................................ 55/337; 219/121.47

(58) Field of Classification Search
USPC ............. 219/121.47, 121.52, 121.59; 55/337; 60/289, 297, 301; 422/29, 186.04
See application file for complete search history.

(56) References Cited

U.S. PATENT DOCUMENTS

| 3,780,502 A | 12/1973 | Dupre et al. |
| 4,040,849 A | 8/1977 | Greskovich et al. |
| 4,214,995 A | 7/1980 | Saylor |
| 4,262,631 A | 4/1981 | Kubacki |

(Continued)

FOREIGN PATENT DOCUMENTS

| CN | 1307505 A | 8/2001 |
| DE | 199 04 082 | 8/2000 |

(Continued)

OTHER PUBLICATIONS

Non-Final Office Action mailed Feb. 3, 2010 in U.S. Appl. No. 11/875,261.

(Continued)

*Primary Examiner* — Brian Jennison
(74) *Attorney, Agent, or Firm* — Foley & Lardner LLP (57) ABSTRACT

A particle collection apparatus is disclosed. The apparatus includes a baghouse housing comprising an entrance port, a collection port, a baghouse configured between the entrance port and the collection port, and a vacuum port coupled to the baghouse. The apparatus also includes a collection mechanism coupled to the collection port; and, a compression mechanism coupled to the baghouse.

12 Claims, 10 Drawing Sheets

(56) References Cited

U.S. PATENT DOCUMENTS

| | | | |
|---|---|---|---|
| 4,400,409 A | 8/1983 | Izu et al. | |
| 4,583,492 A | 4/1986 | Cowher et al. | |
| 4,776,937 A | 10/1988 | Gupta et al. | |
| 4,786,352 A | 11/1988 | Benzing | |
| 4,851,297 A | 7/1989 | Allen et al. | |
| 4,948,750 A | 8/1990 | Kausche et al. | |
| 5,057,163 A | 10/1991 | Barnett et al. | |
| 5,262,357 A | 11/1993 | Alivisatos et al. | |
| 5,336,335 A | 8/1994 | Hall et al. | |
| 5,420,845 A | 5/1995 | Maeda et al. | |
| 5,556,791 A | 9/1996 | Stevens et al. | |
| 5,576,248 A | 11/1996 | Goldstein | |
| 5,585,640 A | 12/1996 | Huston et al. | |
| 5,599,403 A | 2/1997 | Kariya et al. | |
| 5,686,789 A | 11/1997 | Schoenbach et al. | |
| 5,695,617 A | 12/1997 | Graiver et al. | |
| 5,783,498 A | 7/1998 | Dotta | |
| 5,788,738 A | 8/1998 | Pirzada et al. | |
| 5,852,306 A | 12/1998 | Forbes | |
| 5,852,346 A | 12/1998 | Komoda et al. | |
| 5,871,701 A | 2/1999 | Long | |
| RE36,156 E | 3/1999 | Hall et al. | |
| 5,935,898 A | 8/1999 | Trubenbach et al. | |
| 5,958,329 A | 9/1999 | Brown | |
| 6,111,191 A | 8/2000 | Hall et al. | |
| 6,153,113 A * | 11/2000 | Goodrich et al. | 210/782 |
| 6,270,732 B1 * | 8/2001 | Gardner et al. | 422/186.04 |
| 6,358,562 B1 | 3/2002 | Vollath et al. | |
| 6,361,660 B1 | 3/2002 | Goldstein | |
| 6,433,480 B1 | 8/2002 | Stark et al. | |
| 6,515,314 B1 | 2/2003 | Duggal et al. | |
| 6,548,168 B1 | 4/2003 | Mulvaney et al. | |
| 6,559,479 B1 | 5/2003 | Lüdemann | |
| 6,623,559 B2 | 9/2003 | Huang | |
| 6,688,494 B2 | 2/2004 | Pozarnsky et al. | |
| 6,703,081 B2 | 3/2004 | Karner et al. | |
| 6,761,870 B1 | 7/2004 | Smalley et al. | |
| 6,790,311 B2 | 9/2004 | Collins et al. | |
| 6,815,218 B1 | 11/2004 | Jacobson et al. | |
| 6,846,565 B2 | 1/2005 | Korgel et al. | |
| 6,878,871 B2 | 4/2005 | Scher et al. | |
| 6,906,339 B2 | 6/2005 | Dutta | |
| 6,918,946 B2 | 7/2005 | Korgel et al. | |
| 6,951,996 B2 | 10/2005 | Timans et al. | |
| 6,967,172 B2 | 11/2005 | Leung et al. | |
| 6,984,265 B1 | 1/2006 | Raguse et al. | |
| 6,991,972 B2 | 1/2006 | Lochtefeld et al. | |
| 7,060,231 B2 | 6/2006 | Cho et al. | |
| 7,105,428 B2 | 9/2006 | Pan et al. | |
| 7,297,619 B2 | 11/2007 | Sankaran et al. | |
| 7,375,011 B1 | 5/2008 | Kahen | |
| 7,446,335 B2 | 11/2008 | Kortshagen et al. | |
| 7,708,975 B2 | 5/2010 | Plischke et al. | |
| 7,737,382 B2 | 6/2010 | Blankenship | |
| 7,759,599 B2 | 7/2010 | Hawley et al. | |
| 7,862,782 B2 | 1/2011 | Denes et al. | |
| 8,568,684 B2 | 10/2013 | Bi et al. | |
| 8,623,288 B1 | 1/2014 | Dubrow et al. | |
| 2001/0013313 A1 | 8/2001 | Droopad et al. | |
| 2001/0043638 A1 | 11/2001 | Wittle et al. | |
| 2002/0040765 A1 | 4/2002 | Suzuki | |
| 2002/0132045 A1 | 9/2002 | Halas et al. | |
| 2002/0192956 A1 | 12/2002 | Kizilyalli et al. | |
| 2003/0003300 A1 | 1/2003 | Korgel et al. | |
| 2003/0226498 A1 | 12/2003 | Alivisatos et al. | |
| 2004/0229447 A1 | 11/2004 | Swihart et al. | |
| 2005/0005851 A1 | 1/2005 | Keshner et al. | |
| 2005/0008880 A1 | 1/2005 | Kunze et al. | |
| 2005/0104125 A1 | 5/2005 | Sato et al. | |
| 2005/0126628 A1 | 6/2005 | Scher et al. | |
| 2005/0178111 A1 * | 8/2005 | Kammel | 60/289 |
| 2005/0183767 A1 | 8/2005 | Yu et al. | |
| 2005/0205410 A1 | 9/2005 | Babko-Malyi et al. | |
| 2006/0024435 A1 | 2/2006 | Holunga et al. | |
| 2006/0042414 A1 | 3/2006 | Sankaran et al. | |
| 2006/0051505 A1 | 3/2006 | Kortshagen et al. | |
| 2006/0154036 A1 | 7/2006 | Kunze et al. | |
| 2006/0237719 A1 | 10/2006 | Colfer et al. | |
| 2007/0028569 A1 * | 2/2007 | Murphy | 55/337 |
| 2007/0218657 A1 | 9/2007 | Bet et al. | |
| 2007/0252500 A1 | 11/2007 | Ranish et al. | |
| 2007/0271891 A1 | 11/2007 | Chung et al. | |
| 2008/0020304 A1 | 1/2008 | Schroder et al. | |
| 2008/0152938 A1 | 6/2008 | Kelman et al. | |
| 2008/0160265 A1 | 7/2008 | Hieslmair et al. | |
| 2008/0160733 A1 | 7/2008 | Hieslmair et al. | |
| 2008/0206972 A1 | 8/2008 | Kahen | |
| 2008/0307960 A1 | 12/2008 | Hendrickson et al. | |
| 2009/0001517 A1 | 1/2009 | Swanson et al. | |
| 2009/0014423 A1 | 1/2009 | Li et al. | |
| 2009/0044661 A1 | 2/2009 | Li et al. | |
| 2009/0056548 A1 | 3/2009 | Woo et al. | |
| 2011/0020544 A1 | 1/2011 | Matsumoto | |

FOREIGN PATENT DOCUMENTS

| | | |
|---|---|---|
| EP | 0769842 | 12/1999 |
| EP | 1 085 075 A1 | 3/2001 |
| EP | 1085075 | 3/2001 |
| EP | 1551057 A | 7/2005 |
| GB | 2346528 | 8/2000 |
| JP | 61-164823 A | 7/1986 |
| JP | 63-156533 A | 6/1988 |
| JP | 64-047872 A | 2/1989 |
| JP | 03-120383 A | 5/1991 |
| JP | 04-214859 A | 8/1992 |
| JP | 05-138014 A | 6/1993 |
| JP | 06-112133 A | 4/1994 |
| JP | 06-226085 A | 8/1994 |
| JP | 2001-057361 A | 2/2001 |
| JP | 2001-115175 A | 4/2001 |
| JP | 2001-205038 A | 7/2001 |
| JP | 2002-025919 A | 1/2002 |
| JP | 2002-028500 A | 1/2002 |
| JP | 2002-511334 A | 4/2002 |
| JP | 2002-159844 A | 6/2002 |
| JP | 2003-500195 A | 1/2003 |
| JP | 2005/332913 A2 | 12/2005 |
| JP | 2008-508166 A | 3/2008 |
| WO | WO 99/26726 | 6/1999 |
| WO | WO 00/00312 A1 | 1/2000 |
| WO | WO 00/71866 A1 | 11/2000 |
| WO | WO 01/07155 | 2/2001 |
| WO | WO 2004/023527 | 3/2004 |
| WO | WO 2004/068536 | 8/2004 |
| WO | WO 2006/096201 | 9/2006 |
| WO | WO 2008/039757 | 4/2008 |
| WO | WO 2008/073763 | 6/2008 |
| WO | WO 2008/076744 | 6/2008 |
| WO | WO 2009/034865 A1 | 3/2009 |

OTHER PUBLICATIONS

Final Office Action mailed Apr. 2, 2010 in U.S. Appl. No. 11/775,509.
An Office Action issued in U.S. Appl. No. 11/842,466, mailed Jun. 5, 2009.
Notice of Allowance issued in U.S. Appl. No. 11/842,466 mailed Jan. 8, 2010.
Office Action issued in U.S. Appl. No. 11/875,261 mailed Oct. 14, 2009.
Office Action issued in U.S. Appl. No. 11/775,509 mailed Oct. 15, 2009.
W. L. Gore & Associates, Inc., Specification for High Durability Filter Bag, Polytetrafluoroethylene Fabric, Rev. Feb. 7, 2007.
J. H. Turner et al., "Chapter 1: Baghouses and Filters," *Particulate Matter Controls*, EPA/452/B-02-001, Dec. 1998.
"Dust collector," printed from the Internet at http://en.wikipedia.org/wiki/Dust collector, 17 pages; available at least as of Feb. 11, 2009.
"Module 3: Characteristics of Particles—Collection Mechanisms," printed from the Internet at http://www.epa.gov/apti/bces/module3/collect/collect.htm; available at least as of Feb. 10, 2009.

(56) References Cited

OTHER PUBLICATIONS

W. L. Gore & Associates, Inc., Material Safety Data Sheet, MSDS #:12336, Filtration Laminate (8181, 8286, 8383, 8327, XP2233), Apr. 1, 2002.
International Search Report and Written Opinion for PCT/US2008/062182 dated Nov. 4, 2008.
International Search Report and Written Opinion for PCT/US2007/076549 dated Jul. 25, 2008.
Melnikov, D. V., et al., "Quantum Confinement in Phosphorus-Doped Silicon Nanocrystals", *Physical Review Letters*, vol. 92 (2004), pp. 046802-1-046802-4.
Tang, Y. H., et al., "Microstructure and Field-Emission Characteristics of Boron-Doped SI Nanoparticle Chains", *Applied Physics Letters*, vol. 79 (2001), pp. 1673-1675.
Goldstein, A. N., "The Melting of Silicon Nanocrystals: Submicron Thin-film Structures Derived from Nanocrystal Precursors", *Applied Physics A*, vol. 62 (1996) pp. 33-37.
Lake, M.R., et al., "Properties of Powders Deposited by Silane/Hydrogen and Silane/Methane Plasmas," *Journal of Non-Crystalline Solids*, 109, pp. 318-326, 1989.
Zhang, D., "Visible Light Emission From Silicon Nanoparticles," *Mat. Res. Soc. Symp. Proc.*, vol. 256, pp. 35-40, 1992.
Oda, S., "Frequency effects in processing plasmas of the VHF band," *Plasma Sources Sci. Technol.*, vol. 2, pp. 26-29, 1993.
Costa, J., et al., "Microstructural and Vibrational Characterization of the Hydrogenated Amorphous Silicon Powders," *Mat. Res. Soc. Symp. Proc.*, vol. 297, pp. 1031-1036, 1993.
Costa, J., et al., "Preparation of nanoscale amorphous silicon based powder in a square-wavemodulated rf plasma reactor," *Vacuum*, vol. 45, No. 10/11, pp. 1115-1117, 1994.
Liu, X., et al., "Photoluminescence from nanocrystalline embedded in hydrogenated amorphous silicon films prepared by plasma enhanced chemical vapor deposition," Appl. Phys. Lett., vol. 64(2), pp. 220-222, Jan. 10, 1994.
Bertran, E., et al., "Effects of plasma processing on the microstructural properties of silicon powders," *Plasma Sources Sci. Technol.* 3, pp. 348-354, Jan. 14, 1994.
Costa, J., et al., "Unusual photoluminescence properties in amorphous silicon nanopowder produced by plasma enhanced chemical vapor deposition," *Appl. Phys. Lett.*, vol. 64(4), pp. 463-465, Jan. 24, 1994.
Sansonnens, L., et al., "Synthesis of PbS and $SnO_x$ nanoparticles for functional applications," *J. Phys. D: Appl. Phys.*, vol. 27, pp. 1406-1411, Jul. 14, 1994.
Bossel, C., et al., "Processing of nano-scaled silicon powders to prepare slip cast structural ceramics," *Materials Science and Engineering*, A204, pp. 107-112, 1995.
Otobe, M., et al., "Fabrication of Nanocrystalline Si by $SiH_4$ Plasma Cell," *Mat. Res. Soc. Symp. Proc.*, vol. 377, 1995, published by Materials Research Society.
Otobe, M., et al., "Nanocrystalline silicon formation in a $SiH_4$ plasma cell," *Journal of Non-Crystalline Solids*, 198-200, pp. 875-878, 1996.
i Cabarrocas, P.R., et al., "Experimental evidence for nanoparticle deposition in continuous argon-silane plasmas: Effects of silicon nanoparticles on film properties," *J. Vac. Sci. Technol. A*, vol. 14(2), pp. 655-659, Mar./Apr. 1996.
Oda, S., "Preparation of nanocrystalline silicon quantum dot structure by a digital plasma process," *Advances in Colloid and Interface Science*, 71-72, pp. 31-47, 1997.
Gorla, C.R., et al., "Silicon and germanium nanoparticle formation in an inductively coupled plasma reactor," *J. Vac. Sci. Technol. A*, vol. 15(3), May/Jun. 1997.
Ifuku, T., et al., "Fabrication of Nanocrystalline Silicon with Small Spread of Particle Size by Pulsed Gas Plasma," *Jpn. J. AppL Phys.*, vol. 36, Part 1, No. 6B, pp. 4031-4034, Jun. 1997.
Oda, S., "Fabrication of silicon quantum dots by pulsed-gas plasma processes and their properties," (Abstract), Int. Symp. Nanostructures: Phys. Technol., St. Petersburg, pp. 23-27, Jun. 1997.

i Cabarrocas, P.R., et al., "Nanoparticle formation in low-pressure silane plasmas: bridging the gap between a-Si:H and pc-Si films," *Journal of Non-Crystalline Solids*, 227-230, pp. 871-875, 1998.
Gorer, S., et al., "Size-Selective and Epitaxial Electrochemical/Chemical Synthesis of SulfurPassivated Cadmium Sulfide Nanocrystals on Graphite," *J. Am. Chem. Soc.*, vol. 120, 9584-9593, 1998.
Hofmeister, H., et al., "Structure of nanometersized silicon particles prepared by various gas phase processes," *Journal of Non-Crystalline Solids*, 232-234, pp. 182-187, 1998.
Kortshagen, U.R., et al., "Generation and Growth of Nanoparticles in Low-Pressure Plasmas," *Pure and Applied Chemistry*, vol. 71, p. 1871, 1999.
Shi, W., et al., "Parallel Operation of Microhollow Cathode Discharges," *IEEE Transactions on Plasma Science*, vol. 27, No. 1, pp. 16-17, Feb. 1999.
Oda, S., et al., "Nanocrystalline silicon quantum dots prepared by VHF Plasma-enhanced chemical vapor deposition," *J. Phys. IV France*, vol. 11, Pr3-1065-Pr3-1071, 2001.
Shen, Z., et al., "Experimental study of the influence of nanoparticle generation on the electrical characteristics of argon-silane capacitive radio-frequency plasmas," *J. Vac. Sci. Technol. A*, vol. 20(1), pp. 153-159, Jan./Feb. 2002.
Prakash, G., et al., "Nonlinear optical properties of silicon nanocrystals grown by plasma-enhanced chemical vapor deposition," *Journal of Applied Physics*, vol. 91, No. 7, pp. 4607-4610, Apr. 1, 2002.
Viera, G., et al., "Atomic structure of the nanocrystalline Si particles appearing in nanostructured Si thin films produced in low-temperature radiofrequency plasmas," *Journal of Applied Physics*, vol. 92, No. 8, pp. 4684-4694, Jul. 17, 2002.
i Cabarrocas, P.R., et al., "Plasma Grown Particles: From Injected Gases to Nanoparticles and Nanomaterials, from Injected Particles to Dust Clouds in the PKE Experiment," AIP Conference Proceedings, vol. 649(1), pp. 45-52, Dec. 13, 2002.
Vollath, D., et al., "Chapter Eight:: Synthesis of Nanopowders by the Microwave Plasma Process—Basic Considerations and Perspectives for Scaling Up," pp. 219-251 from *Innovative Processing of Films and Nanocrystalline Powders*, ed. Kwang-Leong Choy, Imperial College Press, 2002.
i Cabarrocas, P.R., et al., "Plasma production of nanocrystalline silicon particles and polymorphous silicon thin films for large-area electronic devices," *Pure Appl. Chem.*, vol. 74, No. 3, pp. 359-367, 2002.
Shirai, H., et al., "Luminescent silicon nanocrystal dots fabricated by $SiCl_4/H_2$ RF plasma-enhanced chemical vapor deposition," *Physica E*, vol. 16, pp. 388-394, 2003.
Oda, S., "NeoSilicon materials and silicon nanodevices," *Materials Science and Engineering*, B101, pp. 19-23, 2003.
Yu, J., et al., "Structure and Magnetic Properties of $SiO_2$ Coated $Fe_2O_3$ Nanoparticles Synthesized by Chemical Vapor Condensation Process," *Rev. Adv. Mater. Sci.*, vol. 4, pp. 55-59, 2003.
Choi, C., et al., "Preparation and Characterization of Magnetic Fe, Fe/C and Fe/N Nanoparticles Synthesized by Chemical Vapor Condensation Process," *Rev. Adv. Mater. Sci.*, vol. 5, pp. 487-492, 2003.
Park, N., et al., "Size-dependent charge storage in amorphous silicon quantum dots embedded in silicon nitride," Applied Physics Letters, vol. 83, No. 5, pp. 1014-1016, Aug. 4, 2003.
Penache, C., et al., "Large Area Surface Modification Induced by Parallel Operated MSE Sustained Glow Discharges," printed from the web at hftp://hsboc1.ikf.physik.uni-frankfurt.de/web/publications/files/PenacheHakone2001.pdf prior to Jun. 18, 2004.
Reboredo, F., et al., "Computational Engineering of the Stability and Optical Gaps of SiC Quantum Dots," *Nano Letters*, vol. 4, No. 5, pp. 801-804, 2004.
International Search Report, PCT/US05/21551, Jan. 23, 2007.
Bapat, A., et al., "Synthesis of highly oriented, single-crystal silicon nanoparticles in a low-pressure, inductively coupled plasma," *Journal of Applied Physics* 94(3), Aug. 1, 2003, pp. 1969-1974.
Gorla, C.R., et al., "Silicon and germanium nanoparticle formation in an inductively coupled plasma reactor," *J. Vac. Sci. Technol. A* 15(3), May/Jun. 1997, pp. 860-864.

(56) References Cited

OTHER PUBLICATIONS

Holunga, D. M. et al., "A Scalable Turbulent Mixing Aerosol Reactor for Oxide-Coated Silicon Nanoparticles," *Ind. Eng. Chem. Res.* 2005, 44, 6332-6341; published by American Chemical Society.

Mangolini, L. et al., "High-Yield Plasma Synthesis of Luminescent Silicon Nanocrystals," *Nano Letters*, 2005, vol. 5, No. 4, 655-659; published by American Chemical Society.

Bertran, E. et al., "Production of nanometric particles in radio frequency glow discharges in mixtures of silane and methane," *J. Vac. Sci. Technol. A*, 14(2), Mar./Apr. 1996, 567-571; published by American Vacuum Society.

Dutta, J. et al., "Growth, microstructure and sintering behavior of nanosized silicon powders," *Colloids and Surfaces A: Physicochemical and Engineering Aspects*, 127 (1997) 263-272; published by Elsevier Science B.V.

Furukawa, S. et al., "Quantum size effects on the optical band gap of microcrystalline Si:H," *Physical Review B*, vol. 38, No. 8, Sep. 15, 1988-I; published by The American Physical Society.

Reddy, R. G., "Processing of Nanoscale Materials," *Rev. Adv. Mater. Sci.* 5 (2003) 121-133; published by Advanced Study Center Co. Ltd.

Dutta, J. et al., "Plasma-Produced Silicon Nanoparticle Growth and Crystallization Processes," *Nanoparticles in solids and solutions: preparation, characterization and utilization*, ed. J. H. Fendler, Wiley-VCH, Weinheim, Germany, Chapter 8 (1998), pp. 173-205.

Shen, Z. et al., "Formation of highly uniform silicon nanoparticles in high density silane plasmas," *Journal of Applied Physics*, vol. 94, No. 4, Aug. 15, 2003, 2277-2283; published by American Institute of Physics.

McGrath, "Nano-Enabled Clean Energy," Sep. 28, 2006.

Lee et al., "First Principles Study of the Electronic and Optical Properties of Confined Silicon Systems", *Physical Review B*, V. 51, No. 3 (Jan. 15, 1995), pp. 1762-1768.

Brongersma et al., "Tuning the Emission Wavelength of Si Nanocrystals in Sio2 by Oxidation", *Applied Physics Letters*, V. 72, No. 20 (May 18, 1998), pp. 2577-2579.

Kenyon et al., "Luminescence Efficiency Measurements of Silicon Nanoclusters", *Applied Physics Letters*, V. 73, No. 4 (Jul. 27, 1998) pp. 523-525.

International Search Report for PCT/US2007/077765, mailed Feb. 1, 2008.

Partial International Search Report for PCT/US2008/058036, mailed Aug. 13, 2008.

International Search Report for PCT/US2006/31511, mailed Jun. 12 2008.

Office Action in U.S. Appl. No. 11/875,261 dated Apr. 16, 2009.

Christiansen, T. et al., "Standard Operating Procedure: Spin-on-Glass Surface Level Characterization," Jun. 8, 2000.

Jang, W. I. et al., "Fabrication of Mems Devices by Using Anhydrous HF Gas-phase Etching with Alcoholic Vapor" *J. Micromech. Microeng.*, vol. 12, 2002, pp. 297-306; published by IOP Publishing Ltd.

Kubacki, R. M., "Low Temperature Plasma Deposition of Silicon Nitride to Produce Ultra-Reliable, High Performance, Low Cost Sealed Chip-on-Board (SCOB) Assemblies" *IEEE Transactions on Components, Packaging, and Manufacturing Technology—Part A*, vol. 18, No. 3, Sep. 1995, pp. 471-477.

Lee, J. H. et al, "Gas-Phase Etching of Sacrificial Oxides Using Anhydrous HF and CH₃OH," 10th Annual Internatl Workshop on MEMS, IEEE, Jan. 26-30, 1997, pp. 448-453.

Orfert, M. et al., "Plasma Enhanced Chemical Vapor Deposition of SiN-films for Passivation of Three-Dimensional Substrates" *Surface and Coatings Technology 116-119*, 1999, pp. 622-628; published by Elsevier Science S.A.

Schmid, P. et al, "Plasma deposition of Si—N and Si—O passivation layers on three-dimensional sensor devices" Surface and Coating Technology 98, 1998, pp. 1510-1517; published by Elsevier Science S.A.

Ai et al., "Preparation and characterization of Si sheets by renewed SSP technique," *Journal of Crystal Growth*, vol. 270 (2004), pp. 446-454.

Q. Ban, et al., "Substrate Materials for Poly-CSiTF Solar Cells: Optimization of Silicon Sheet from Powder", *Acta Metallurgica Sinica*, vol. 18, No. 3 (Jun. 2005), pp. 184-188.

Q Ban et al., "Study on Preparation Technology of Polycrystalline Silicon Thin Film Solar Cells Based on SSP Substrate", *Acta Energiae Solaris Sinica*, vol. 25, No. 1 (Feb. 2004), pp. 95-98.

Bet et al., "Laser Forming of Silicon Films Using Nanoparticle Precursor" *Journal of Electronic Materials*, vol. 35, No. 5 (2006), pp. 993-1004.

Britton, D.T. and M. Harting, "Printed Nanoparticulate Composites for Silicon Thick Film Electronics," *Pure and Applied Chemistry*, vol. 78, No. 9 (2006), 1723-1739.

Ghosh et al., "Theory of the electrical and photovoltaic properties of polycrystalline silicon" *Journal of Applied Physics*, vol. 51, No. 1 (1980) pp. 446-454.

Grovenor, C R M, "Grain boundaries in semiconductors," *J. Phys. C: Solid State Phys.*, vol. 18 (1985), pp. 4079-4119.

Liang et al, "Characterisation of direct epitaxial silicon thin film solar cells on a low-cost substrate," *Solar Energy Materials & Solar Cells*, vol. 80 (2003), pp. 181-193.

Mataré, H.F., "Carrier transport at grain boundaries in semiconductors," *Journal of Applied Physics*, vol. 56, No. 10 (1984), pp. 2605-2631.

McCann et al, "A Review of Thin Film Crystalline Silicon for Solar Cell Applications. Part 1: Native Substrates," *Solar Energy Materials and Solar Cells*, vol. 68, No. 2 (May 2001).

Moller et al., "Sintering of Ultrafine Silicon Powder," *Journal of the American Ceramic Society*, vol. 68, No. 6 (1985), pp. 320-325.

Yang et al., "Effect of pressure on melting temperature of silicon," *Journal of Physics: Condensed Matter*, vol. 15 (2003), pp. 4961-4965.

"Crystalline Silicon Thin-Film Solar Cells," a Product Information Sheet published by Fraunhofer Institut Solare Energie Systeme, Oct. 2001, pp. 1-6.

T. Shiga et al., "Photovoltaic performance and stability of CdTe/polymeric hybrid solar cells using a C60 buffer layer," *Solar Energy Materials and Solar Cells*, vol. 90, No. 12, (Jan. 2006), pp. 1849-1858; published by Elsevier Science Publishers, Amsterdam, NL.

International Search Report and Written Opinion for PCT/US2007/087205, mailed May 28, 2008.

International Search Report for PCT/IB2004/000221 (WO 2004/068536 A2), mailed Aug. 30, 2004.

International Search Report/Written Opinion for PCT/US2007/086376, mailed May 28, 2008.

International Search Report/Written Opinion for PCT/US2007/086432, mailed May 28, 2008.

International Search Report for PCT/US2007/070134, mailed Aug. 11, 2008.

International Search Report for PCT/US2008/059038, mailed Jul. 18, 2008.

J. R. Heath et al., "Nanocrystal Seeding: A low temperature route to polycrystalline Si films," *Applied Phys. Lett.* vol. 64, No. 26, Jun. 27, 1994, pp. 3569-3571.

G. Samdani et al., "Tiny Particles Aim for Big Markets," *Chemical Eng.*, Aug. 1994, pp. 35-39.

Ph. Buffat et al., "Size Effect on the Melting Temperature of Gold Particles," *Physical Review A*, vol.13, No. 6, Jun. 1976.

F. Ercolessi et al., "Melting of Small Gold Particles: Mechanism and Size Effects," *Physical Review Letters*, vol. 66, No. 7, Feb. 18, 1991, pp. 911-914; published by the American Physical Society.

M. Wautelet, "Estimation of the variation of the melting temperature with the size of small particles, on.The basis of a surface-phonon instability model,:" *J. Phys. D: Appl Phys*, vol. 24 (1991), pp. 343-346; published by IOP Publishing Ltd.

R. S. Berry et al., "Melting of Clusters and Melting," *Physical Review A*, vol. 30, No. 2, Aug. 1984;.published by the American Physical Society.

International Search Report and Written Opinion mailed May 27, 2010, in PCT/US2010/030885, 8 pages.

* cited by examiner

METHODS AND APPARATUS FOR THE IN SITU COLLECTION OF NUCLEATED PARTICLES

CROSS-REFERENCE TO RELATED APPLICATIONS

This application is a continuation-in-part of U.S. patent application Ser. No. 11/775,509, entitled, "Concentric Flow-Through Plasma Reactor And Methods Therefor," filed Jul. 10, 2007, which is incorporated by reference.

FIELD OF THE INVENTION

This invention relates in general to in-situ particle nucleation and in particular to methods and apparatus for the substantially continuous in situ collection of nucleated particles.

BACKGROUND

In general, gas phase synthesis is an efficient way to generate relatively pure particles. Whether plasma, laser pyrolysis, or some other method, a set of precursor gases is flowed into a reaction zone where atoms and/or molecules in the set of precursor first gases ionize and then nucleate. Once present, the nucleated particles will tend to coagulate into soft particle agglomerates, and if enough energy is present, to sinter into hard agglomerates. However, in practice, these agglomerates will tend to clog pumps, block filters, and coat just about any surface to which they come in contact.

For example, a common type of particle collection apparatus is known as a baghouse. Using a fabric bag to filtrate and separate the particles and agglomerates, the baghouse provides a surface on which dust particulates collect through inertial collection, Brownian movement, and electrostatic forces. The fabric bags may be of woven or felted cotton, synthetic, or glass-fiber material in either a tube or envelope shape.

Inertial collection involves the striking of particles on cloth fibers placed perpendicular to the gas-flow (direction instead of changing direction with the gas stream). Browning movement involves probability of contact between the particles and surfaces in the particle collection apparatus because of the diffusion of particles. And electrostatic forces involve the presence of an electrostatic charge on both the particles and the fabric filter in order to increase particle capture.

However, these particle collection mechanisms also tend to result in the formation of particle agglomerate caking on internal particle collection apparatus surfaces, and in particular on the fabric filter, which increases the resistance to gas flow thus back pressure on the vacuum pump. Thus, the filter must be cleaned periodically, often requiring gas phase synthesis apparatus to be taken offline, which may substantially reduce the overall production rate.

In view of the foregoing, there are desired methods of improved methods and apparatus for the continuous in situ collection of particles.

SUMMARY

The invention relates, in one embodiment, to a particle collection apparatus. The apparatus includes a baghouse housing comprising an entrance port, a collection port, a baghouse configured between the entrance port and the collection port, and a vacuum port coupled to the baghouse. The apparatus also includes a collection mechanism coupled to the collection port; and, a compression mechanism coupled to the baghouse.

DETAILED DESCRIPTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, agglomerates from gas phase synthesis will tend to clog pumps, block filters, and coat just about any surface to which they come in contact. The inventors believe that in an advantageous manner, an optimized compressible baghouse coupled to a vacuum pump and positioned perpendicular to the particle flow may be used to collect particles and agglomerates in a substantially continuous manner.

Figures 1A, 1B:
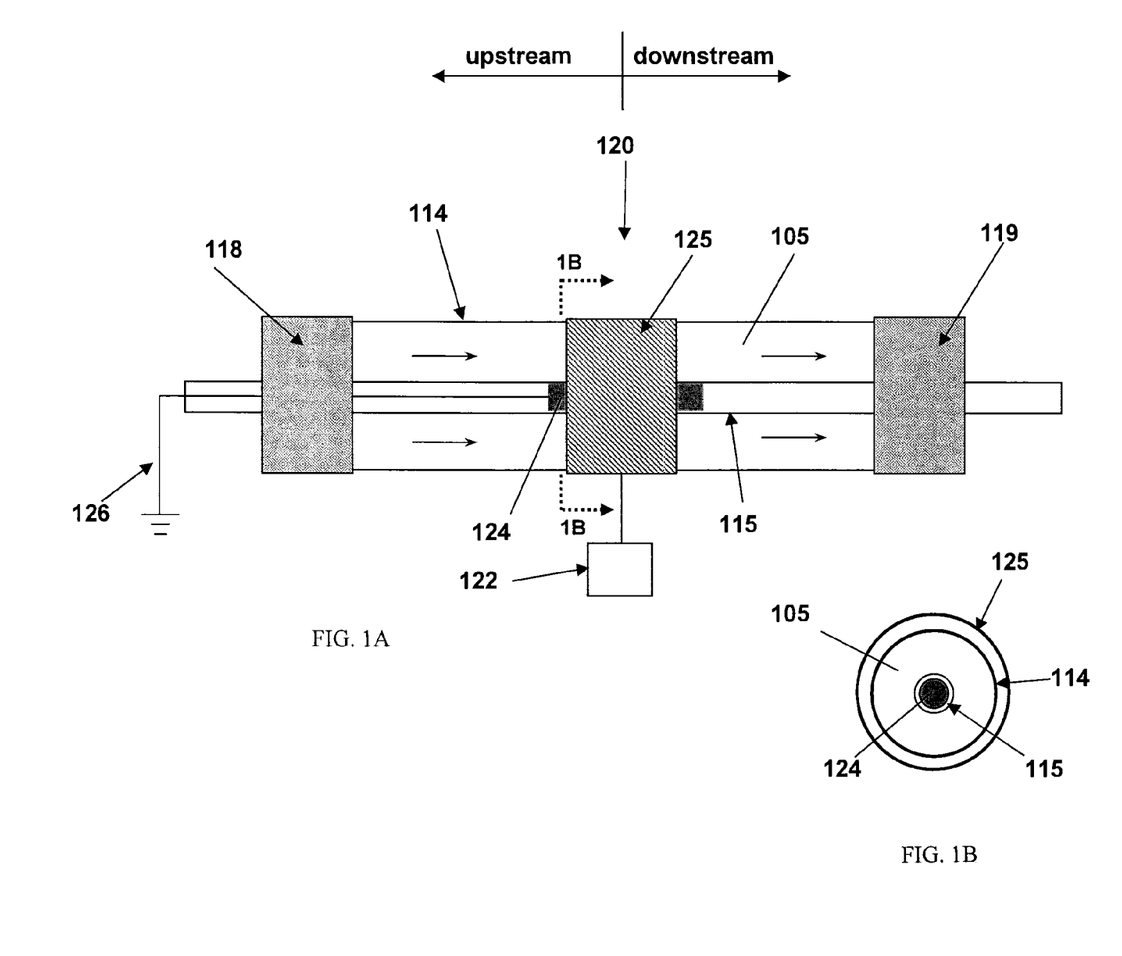
FIGS. 1A-B show simplified schematic side and cross-sectional side views of a plasma reactor, in accordance with the invention.

Referring now to FIGS. 1A-B, a set of simplified diagrams of a plasma reactor that may be coupled to a particle collection apparatus is shown, in accordance with the invention. FIG. 1A shows a simplified schematic side diagram, whereas FIG. 1B shows a simplified cross-sectional diagram.

In general, the plasma reactor includes an inner electrode, an inner dielectric layer over the inner electrode, an outer dielectric layer over the inner dielectric layer, and an outer electrode over at least a portion of the outer dielectric layer. A channel is defined between an outer surface of the inner electrode and a surface of the outer electrode facing the outer surface of the inner electrode, which is referred to herein as an "inner surface" of the outer electrode. The channel defines a plasma reactor chamber of the plasma reactor. In one configuration, the outer electrode is disposed around and is in coaxial relation to the inner electrode. In such a case, an annular channel is defined between the outer surface of the inner electrode and the inner surface of the outer electrode.

In advantageous manner, particles may be produced by continuously flowing one or more precursor gases into the plasma reactor chamber and forming (or igniting) a plasma of the precursor gases in the plasma reactor chamber by applying RF power to either the inner or outer electrode of the plasma reactor.

The inner electrode may be in contact with the inner dielectric layer and the outer electrode may be in contact with at least a portion of the outer dielectric layer. The inner dielectric layer is separated from the outer dielectric layer such that a space is formed between the inner and outer dielectric layers. The space defines a channel, which is also referred to as a plasma reactor chamber of the plasma reactor. One or more precursor gases are directed through the plasma reactor chamber.

In one configuration, the plasma reactor is tubular. That is, the inner and outer dielectric layers are tubular or tube like. The inner dielectric tube circumscribes the inner electrode, the outer dielectric tube circumscribes the inner dielectric tube and the outer electrode circumscribes the outer dielectric tube. The space between the inner and outer dielectric tubes defines an annular channel.

Plasma reactor 100, also referred to herein as a "concentric electrode" plasma reactor, comprises an inner electrode 124; an inner dielectric tube 115 circumscribing the inner electrode 124; an outer dielectric tube 114 disposed around and in coaxial relation with the inner dielectric tube 115, wherein an annular channel is defined between an outer surface of the inner dielectric tube 115 and an inner surface of the outer dielectric tube 114; and an outer electrode 125 disposed around (or circumscribing) at least a portion of the outer dielectric tube.

The inner dielectric tube 115 can be in contact with an outer surface of the inner electrode 124. The outer electrode 125 is disposed over an outer surface of the outer dielectric tube 114. The outer electrode 125 can be in contact with at least a portion of the outer surface of the outer dielectric tube 114. The inner electrode 124 and outer electrode 125 collectively define an electrode assembly 120 of the plasma reactor 100. As discussed in more detail below, the plasma reactor 100 can comprise a plurality of electrode assemblies 120.

An annular channel defines a plasma reactor chamber 105. In one configuration, the inner electrode 124 is rod shaped. However, the inner electrode 124 can have various geometric shapes and sizes. For example, the inner electrode 124 can be rectangular. The inner 115 and outer 114 dielectric tubes are preferably formed of a dielectric material, such as quartz. The dielectric tube 114 forms the outer wall of the plasma reactor chamber 105 of the plasma reactor 100. The plasma reactor chamber 105 provides a flow path for particle precursor gases. The plasma reactor chamber 105 may be sealed from the ambient atmosphere by flanges 118 and 119 at opposing ends of the plasma reactor 100. The dielectric tube 115 prevents sputtering of the inner electrode 124 when the plasma reactor 100 is in operation. This advantageously prevents contamination of the particles with material that forms the inner electrode 124.

In general, when the plasma reactor 100 is in operation, particle precursor gases flow from the upstream end of the plasma reactor 100 toward the downstream end of the plasma reactor 100. Plasma of the particle precursor gases is formed in a reaction zone of the plasma reactor chamber 105. The reaction zone is an area in the plasma reactor chamber 105 that is defined by the inner 124 and outer 125 electrodes, in addition to the RF power density. The RF power density is a function of the separation distance between the surfaces of the inner electrode 124 and outer electrode 125, as well as the disposition of the inner electrode 124 in relation to the outer electrode 125.

During plasma formation, particle precursor gas molecules dissociate to form plasma-excited species of the particle precursor gas molecules. At least some of the plasma-excited species of the particle precursor gas molecules may nucleate and grow into particles. The precursor gases are desirably mixed with a buffer gas that acts as a carrier gas. The buffer gas is typically an inert gas with a low thermal conductivity. In general, the buffer gas comprises one or more inert gases selected from the group consisting of He, Ne, Ar, Kr, Xe and $N_2$.

In addition, the precursor gases may contain precursor molecules that dissociate to provide precursor species that react to form particles with a desired composition. The precursor gases directed into the plasmas reactor chamber will depend on the type of particles desired. If doped Group IV semiconductor nanoparticles are desired, the one or more nanoparticle precursor gases may include one or more semiconductor precursor gases (e.g., $SiH_4$, $Si_2H_6$) and one or more dopant gases (e.g., $PH_3$, $B_2H_6$).

If the inner 124 and outer 125 electrodes span the entirety of the plasma reactor chamber 105, the reaction zone can span the length of the plasma reactor chamber 105. In general, the reaction zone is a function of the width of the outer electrode 125 and the RF power density. To a rough approximation, the reaction zone spans a portion of the plasma reaction chamber 105 in-between the inner electrode 124 and outer electrode 125; it can be about as wide as the outer electrode 125.

Generally, plasma of the precursor gases is formed in the reaction zone, and particles are formed, at least in part, in the reaction zone. In one configuration, particles are formed solely in the reaction zone. In other configurations in which plasma reactor 100 comprises multiple electrode assemblies 120, plasma reactor 100 may comprise multiple reaction zones, in which case plasma of precursor gases is formed in each of the reaction zones. This may be of advantage in the formation of core-shell particles.

Referring now to FIGS. 2A-D, a set of simplified diagrams showing a particle collection apparatus configured with an angular lateral expansion structure, in accordance with the invention. In an advantageous manner, the longitudinal axis of a compressible baghouse is coupled to a vacuum pump and positioned in a substantially perpendicular manner to a generally heated particle effluent flow. As the vacuum pump removes gas molecules from the particle collection apparatus, and through the baghouse, a substantial portion of the particles tend to form (soft and hard) agglomerates in the effluent flow.

A first portion of these (agglomerated and non-agglomerated) particles will tend to collect on and then flake from relatively cooler inner surfaces of the baghouse housing. A second portion the particles are directly collected in a collection apparatus that is positioned parallel to the nucleated particle effluent flow. However, the remaining particles will be sucked by the vacuum pump and clump on the outer surface of the baghouse. Closed on one end and further secured to a baghouse housing around a vacuum pump exit port, the baghouse may be configured as a porous fabric cylinder positioned around a angular lateral expansion structure to keep the fabric substantially taught (e.g., spring, coiled Teflon tubing, etc.). In general, the fabric has a weave size that is larger than the evacuated gas molecules, but smaller than a substantial portion of the particles. An example of a suitable fabric is GORE expanded polytetrafluoroethylene with a thickness of about 0.25 mm, a breaking strength of about 979 N/2.54 cm, and a pore size 0.02-40 µm.

In general, the vacuum pump is configured as a roughing (or two-stage) pump, in which a first stage produces a vacuum of up to about $1\times10^{-3}$ torr, and a second stage produces a lower vacuum, such as 0.5 millitorr. Examples of roughing pumps include rotary vane, rootes lobe, rotary piston, scroll, diaphragm, hook & claw, screw rotor, dry piston, and sorption. In a common configuration, the vacuum pump further includes a butterfly valve with a flapper mechanism. Generally configured as circular disk with an o-ring around its circumference, the flapper mechanism rotates about its diameter in a cone-shaped bore of the butterfly valve.

Here, as particles are first being nucleated and then deposited on the baghouse fabric, the butterfly valve attempts to maintain a substantially constant pressure by adjusting the flapper (opening the flapper increases vacuum whereas closing it decreases vacuum). However, as the outer surface of the baghouse becomes substantially covered with particles, back-pressure increases on the vacuum pump, which in turn causes the butterfly valve to open in order to compensate. In one configuration, the baghouse is allowed to compress along its longitudinal axis (perpendicular to particle effluent flow) in response to changes in pressure. In an alternate configuration, the baghouse is fixed and may be automatically or manually adjusted to changes in back pressure.

In an advantageous manner, after a back-pressure threshold is reached, such as when a fully open flapper (i.e., parallel to the flow), cannot reduce the back-pressure, the baghouse may be compressed and rotated, much like wringing a towel, in order to unclog the baghouse fabric pours and allow a substantial portion of the particles to flake off and be collected in the collection apparatus. Once back-pressure is reduced, the baghouse is expanded and the process repeats itself. Consequently, nucleated particles may be collected over an extended period of time without the need to open and clean the baghouse.

Figure 2A:
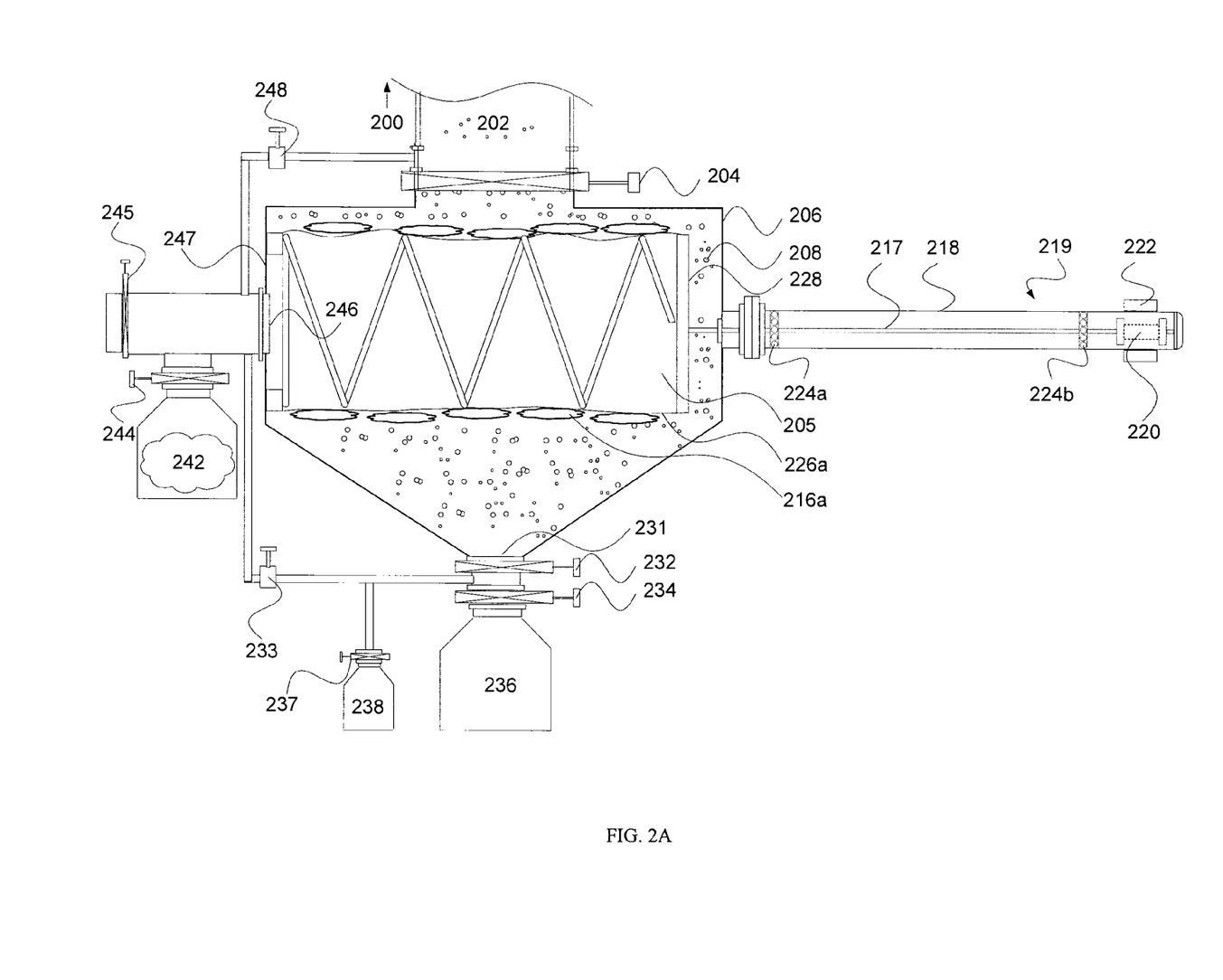
FIGS. 2A-D show a set of simplified diagrams of a particle collection apparatus configured with an angular lateral expansion structure, in accordance with the invention.

FIG. 2A shows the particle collection apparatus in which a baghouse spring is substantially uncompressed. Initially, nucleated particles 208 enter baghouse housing 206 through entrance port 202. And although a portion of the particles 208 coat the inner surface of baghouse housing 206, or are directly collected through collection port 231 by collection apparatus 236, a substantial proportion are attracted to baghouse 205 (forming particle clumps 216a on fabric 226a) by a pressure differential maintained by a vacuum pump (not shown) coupled to vacuum port 246. In general, collection apparatus 236 is typically a vessel that can be sealed (for transport) and can withstand a relatively low vacuum (i.e., stainless steel, etc.).

Positioned such that its longitudinal axis is perpendicular to the effluent flow, baghouse 205 is configured as a substantially cylindrical tube closed on one end and further secured to a baghouse housing around a vacuum pump exit port, the baghouse may be configured as a cylinder of porous fabric 226a positioned around a lateral expansion structure 207 to keep the fabric substantially taught. On a first end of the cylindrical tube (positioned opposite to vacuum port 246), a closed circular cross-section cap 228 is positioned to substantially seal the interior of the of the baghouse from the particles, and to further to provide a lateral support structure for compression mechanism 219. In a typically configuration, the closed circular cross-section cap 228 comprises a substantially inert and stiff material (i.e., Teflon, etc.). In contrast, on a second end of the cylindrical tube, an open circular cross-section 247 may be directly attached to an inner surface of baghouse housing 206 around vacuum port 246 in order to substantially close the interior of the cylindrical tube from the nucleated particle effluent flow.

Configured to compress and twist baghouse 205, baghouse compression mechanism 219 includes a baghouse mechanical force transfer structure 217 positioned in baghouse compression mechanism housing 218 via a set of bearings 224a-b. Directly coupled to circular cross-section cap 228, baghouse mechanical force transfer structure 217 may be configured as a rod, cylinder, etc. and further be comprised of anodized aluminum, stainless steel, or other suitable material.

In one configuration, baghouse mechanical force transfer structure 217 may be moved via magnetic actuator comprising (1) an inner slide 220 made from a ferromagnetic material (i.e., iron, etc.) coupled to baghouse mechanical force transfer structure 217 inside baghouse compression mechanism housing 218, and (2) yoke 222 comprising a set of strong, permanent magnets positioned outside compression mechanism housing 218 and further magnetically coupled to an inner slide 220. In one configuration, yoke 222 is comprised of rare-earth magnets comprising lanthanides (e.g., neodymium, samarium-cobalt, etc.).

For example, in a typical operating configuration in which a vacuum of about 1 Torr to about 30 Torr is maintained at vacuum port 246, a magnetic actuator configured with 5 lbs of linear force and 60 oz-in of rotary force is sufficient to compress and rotate baghouse 205 in order to substantially clear particle clumps 216a from fabric 226a.

Furthermore, inert gas may be used to purge various sub-components of particle collection apparatus. For example, in order to remove collected particles, collection apparatus 236 must be decoupled from baghouse housing 206. Consequently, in order to minimize ambient contamination, an inert gas (e.g., nitrogen, etc.) 238 is generally injected into collection apparatus 236. Initially, collection apparatus 236 is isolated by closing isolation valve 232 and valve 233. Inert gas valve 237 is then opened allowing inert gas 238 to flow into collection apparatus 236. Isolation valve 232 and isolation valve 234 are then closed, allowing collection apparatus 236 to be removed.

In addition, an inert gas may be used to help dislodge particles from baghouse 205 when compressed. Initially, isolation valve 204, isolation valve 245, and isolation valve 248 are closed. Next, inert gas valve 244 is opened, allowing inert gas 242 to flow into baghouse 205 and expel particles that have caked on fabric 226a.

Figure 2B:
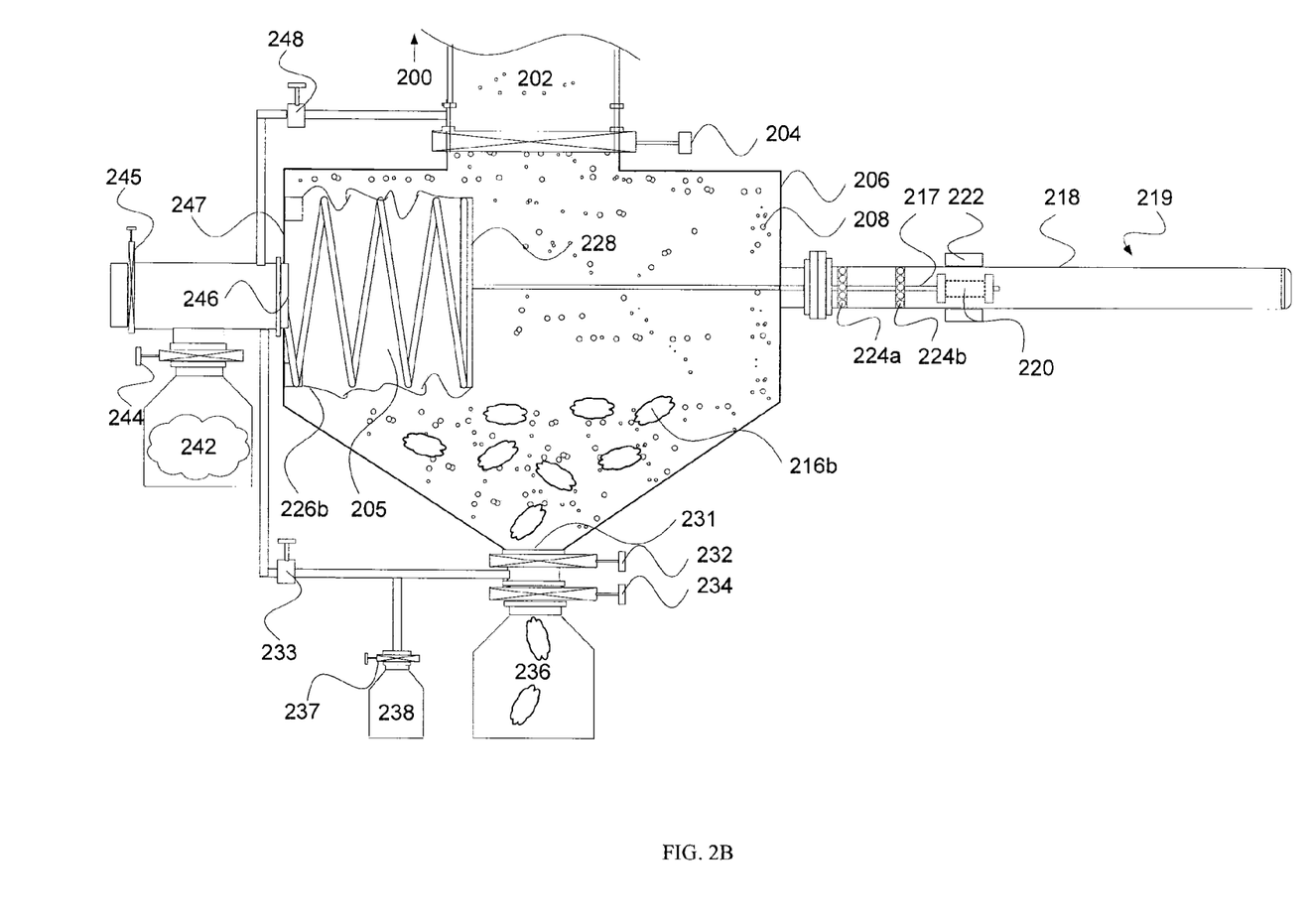

FIG. 2B shows the particle collection apparatus of FIG. 2A in which the baghouse spring is substantially compressed and twisted. In an advantageous manner, baghouse 205 may be compressed and twisted in a clockwise or counter-clockwise manner in order to substantially remove caked nucleated particles from a crumpled fabric 226b. In addition, as previously described, inert gas 242 may be used to help dislodge particles from baghouse 205.

Figure 2C:
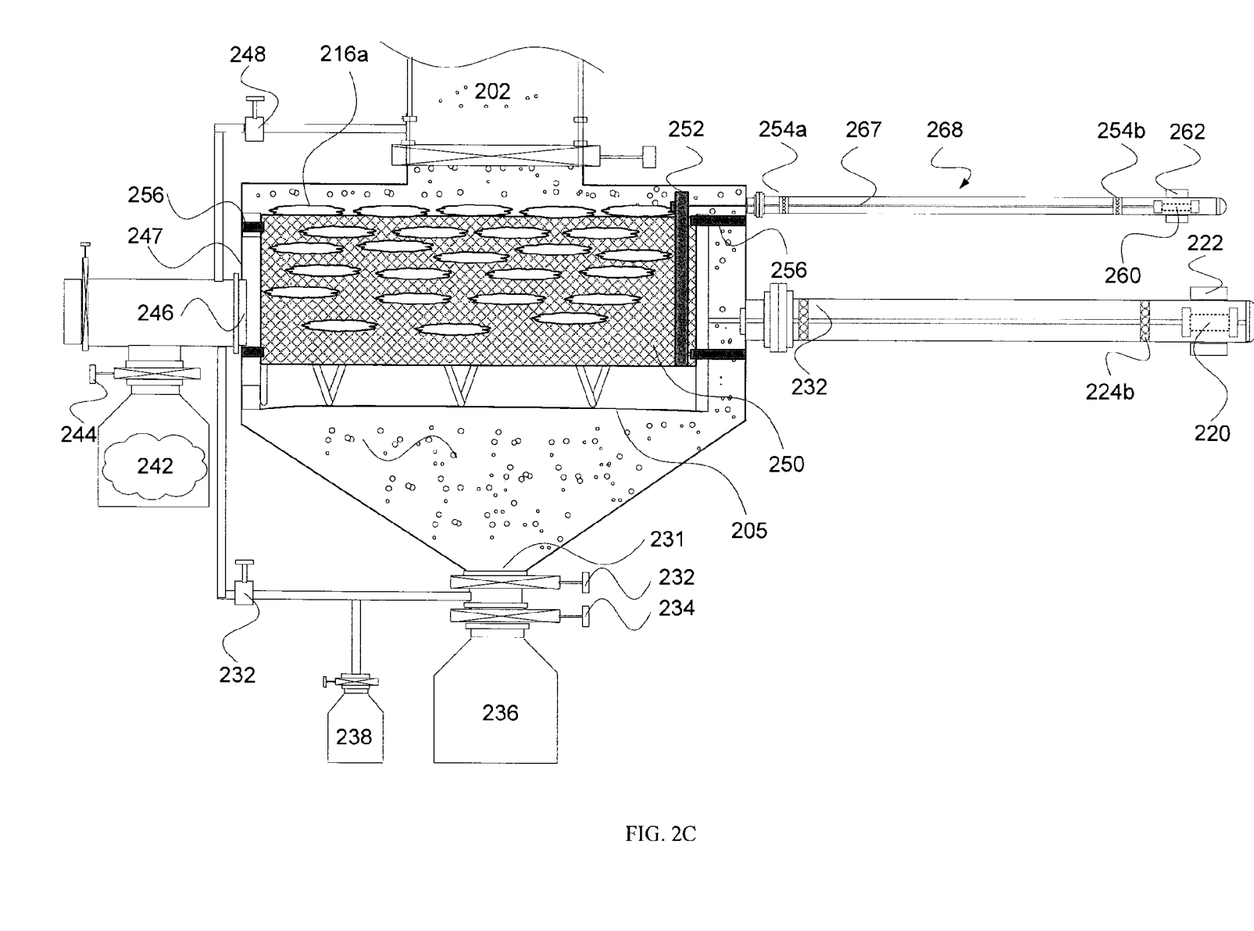

FIG. 2C shows the particle collection apparatus of FIG. 2A with a mesh screen positioned outside and along the longitudinal axis of an uncompressed baghouse, in accordance with the invention. In an advantageous manner, as the particle effluent flows through entrance port 202 toward baghouse 205, a substantial volume of this flow is intercepted by and collected on a mesh screen 250 that is further configured perpendicular to the effluent flow. Consequently, the particle collection apparatus may be operated for a longer period of time, when compare to the particle collection apparatus of FIG. 2A-B.

In a common configuration, mesh screen 250 is comprised of a substantially stiff inert material (chemically inactive), such as Teflon, with a mesh size of between about 0.2 microns to about 2 microns. In addition, mesh screen 250 may be configured as a cylinder or a semi-cylinder. Mesh screen 250 maybe further secured to the interior surface of the particle collection apparatus via inert attachment support structures 256.

Positioned longitudinally around the outside surface of mesh screen 250 is mesh scraper 252 further configured to slide along the outer surface of mesh screen 250 and remove particle clumps 216a via mesh scraper compression mechanism 267. Mesh scraper compression mechanism 267 further includes a mesh scraper mechanical force transfer structure 268 positioned in mesh scraper compression mechanism housing 267 via a set of bearings 254a-b. Directly coupled to mesh scraper circular cross-section cap 252, baghouse mechanical force transfer structure 268 may be configured as a rod, cylinder, etc. and further be comprised of anodized aluminum, stainless steel, or other suitable material.

In one configuration, mesh screen mechanical force transfer structure 267 may be moved via a mesh scraper magnetic actuator comprising (1) a mesh scraper inner slide 260 made from a ferromagnetic material (i.e., iron, etc.) coupled to mesh scraper mechanical force transfer structure 267 inside baghouse compression mechanism housing 268, and (2) mesh scraper yoke 262 comprising a set of strong, permanent magnets positioned outside mesh scraper compression mechanism housing 268 and further magnetically coupled to an mesh scraper anchor 620. In one configuration, mesh scraper yoke 262 is comprised of rare-earth magnets comprising lanthanides (e.g., neodymium, samarium-cobalt, etc.).

For example, in a typical operating configuration in which a vacuum of about 1 Torr to about 30 Torr is maintained at vacuum port 246, a mesh scraper magnetic actuator configured with 5 lbs of linear force and 60 oz-in of rotary force is sufficient to compress and rotate baghouse 205 in order to substantially clear particle clumps 216a from mesh screen 250.

Figure 2D:
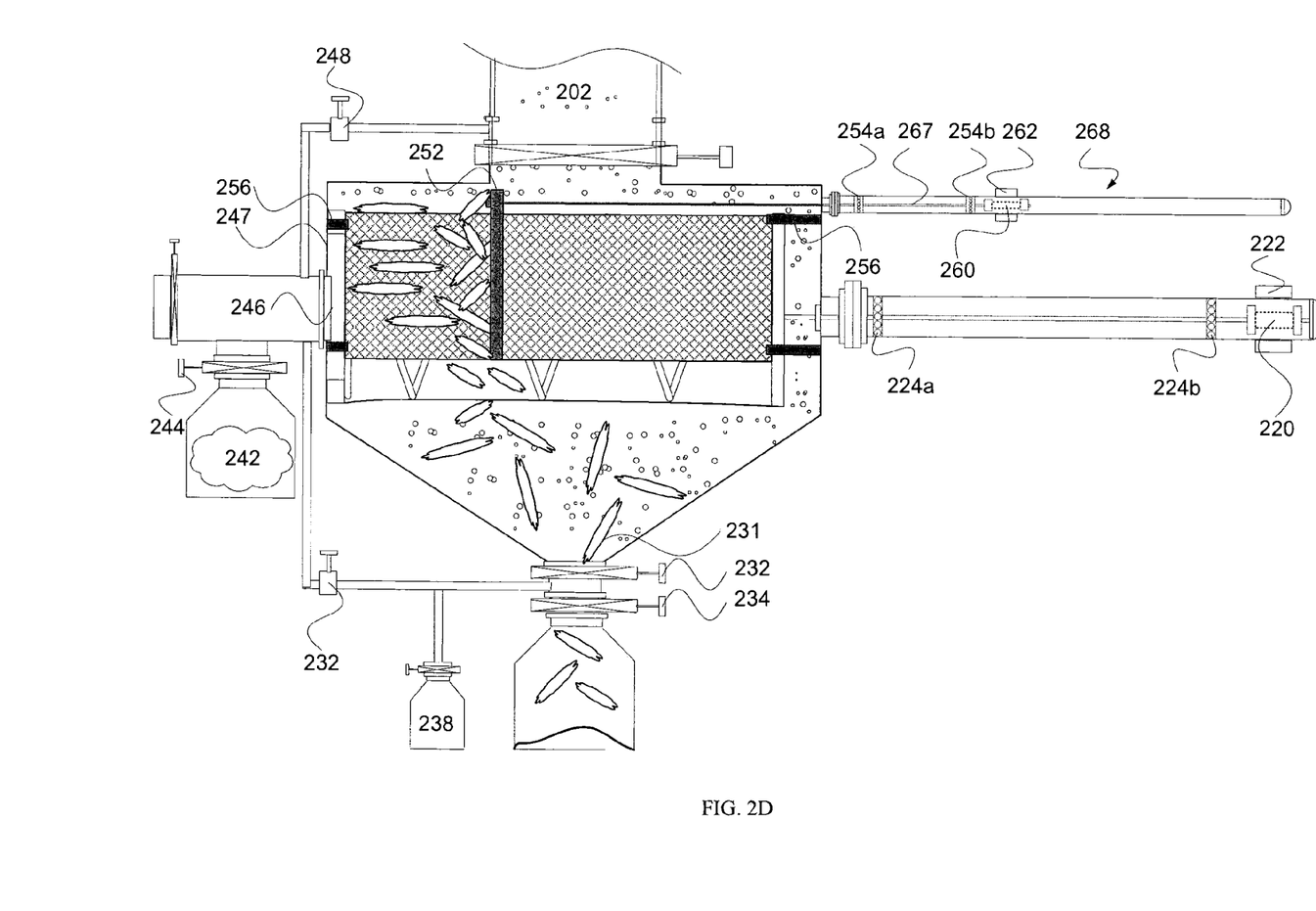

FIG. 2D shows the particle collection apparatus of FIG. 2C in which the mesh screen is moved forward toward vacuum port 246. In an advantageous manner, caked nucleated particles 216b may be removed.

Figure 3A:
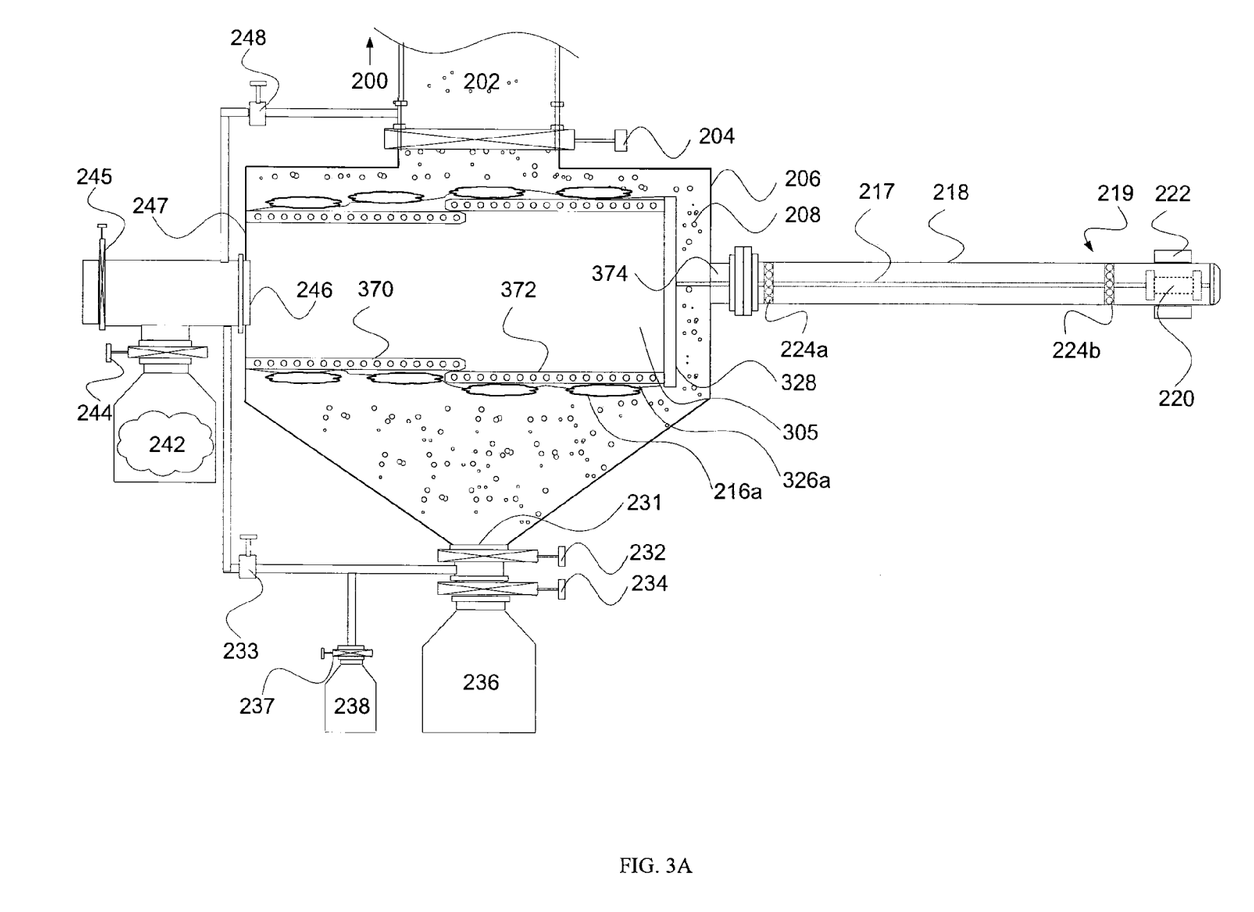
FIGS. 3A-C show a set of simplified diagrams of a particle collection apparatus configured with a cylindrical lateral expansion structure, in accordance with the invention.
Figure 3B:
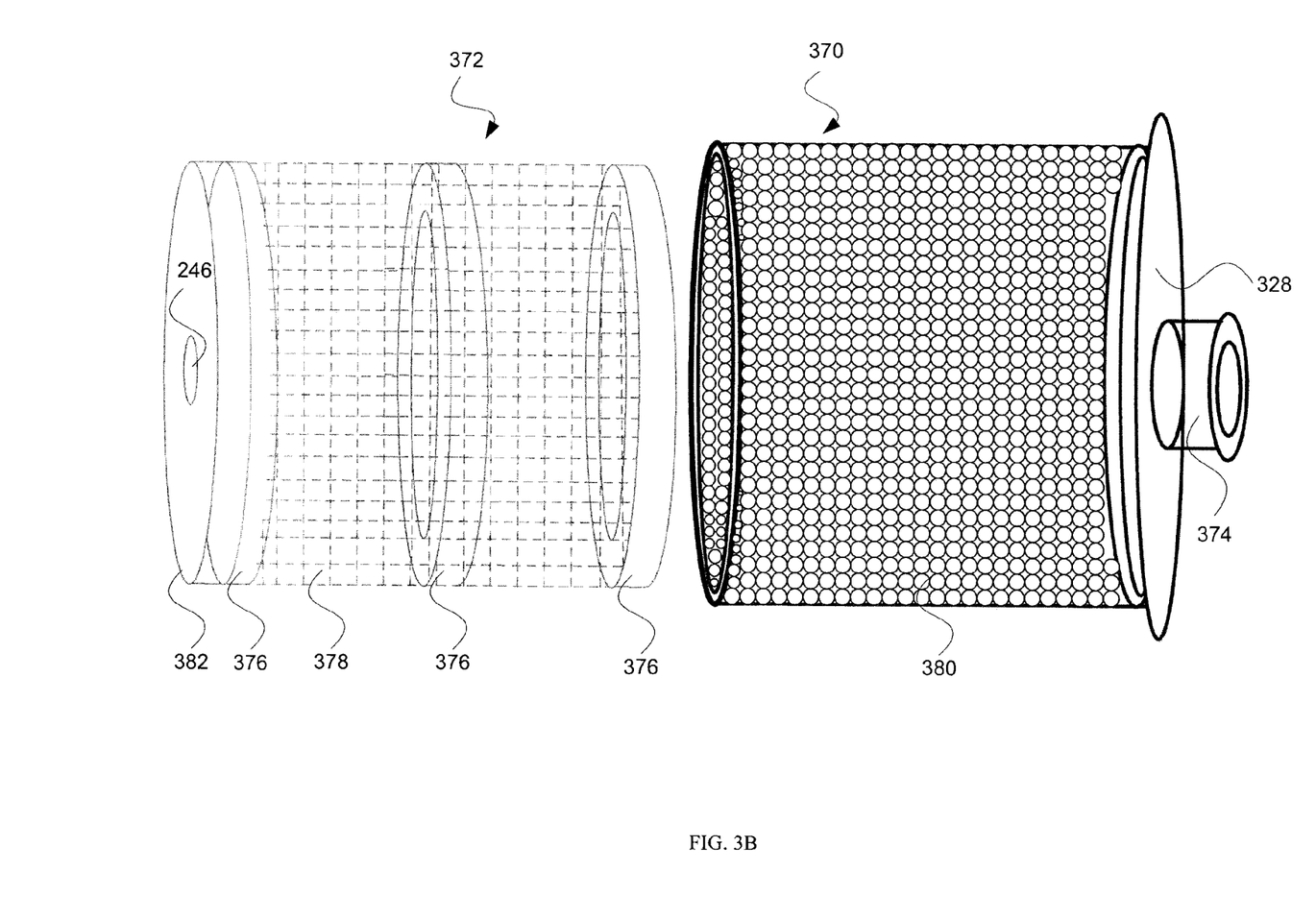
Figure 3C:
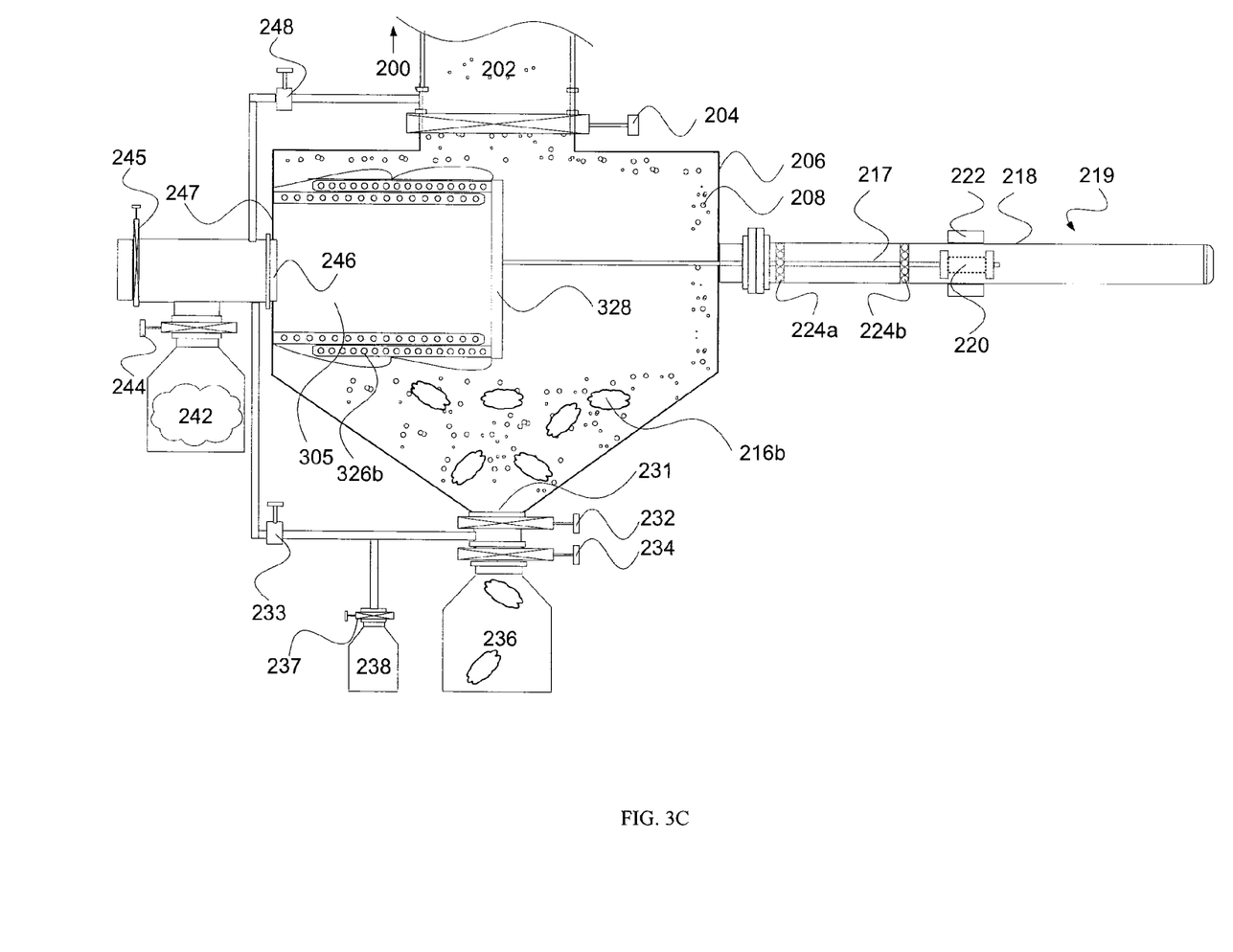

Referring now to FIGS. 3A-C, a set of simplified diagrams showing a particle collection apparatus configured with a cylindrical lateral expansion structure, in accordance with the invention. That is, unlike linear lateral expansion structure 207 of FIGS. 2A-B, a set of porous cylinders 370 and 372 are configured inside baghouse 305 in order to keep the fabric substantially taught. The diameter of a first cylinder is smaller than that of a second cylinder, such that both cylinders maybe expanded and contracted freely.

FIG. 3A shows the particle collection apparatus in which a cylindrical lateral expansion structure is substantially uncompressed. As before, nucleated particles 208 enter baghouse housing 206 through entrance port 202. And although a portion of the particles 208 coat the inner surface of baghouse housing 206, or are directly collected by collection apparatus 236, a substantial proportion are attracted to baghouse 205 (forming particle clumps 216a on fabric 226a) by a pressure differential maintained by a vacuum pump (not shown) coupled to vacuum port 246. In general, collection apparatus 236 is typically a vessel that can be sealed (for transport) and can withstand a relatively low vacuum (i.e., stainless steel, etc.).

Positioned such that its longitudinal axis is perpendicular to the effluent flow, baghouse 205 is configured as a substantially cylindrical tube closed on one end and further secured to a baghouse housing around a vacuum pump exit port, the baghouse may be configured as a cylinder of porous fabric 226a positioned around a lateral expansion structure 207 to keep the fabric substantially taught. On a first end of the cylindrical tube (positioned opposite to vacuum port 246), a closed circular cross-section cap 228 is positioned to substantially seal the interior of the of the baghouse from the particles, and to further to provide a lateral support structure for compression mechanism 219. In a typically configuration, the closed circular cross-section cap 228 comprises a substantially inert and stiff material (i.e., Teflon, etc.). In contrast, on a second end of the cylindrical tube, an open circular cross-section 247 may be directly attached to an inner surface of baghouse housing 206 around vacuum port 246 in order to substantially close the interior of the cylindrical tube from the nucleated particle effluent flow.

Configured to compress baghouse 305, baghouse compression mechanism 219 includes a baghouse mechanical force transfer structure 217 positioned in baghouse compression mechanism housing 218 via a set of bearings 224a-b. Directly coupled to circular cross-section cap 328, baghouse mechanical force transfer structure 217 may be configured as a rod, cylinder, etc. and further be comprised of anodized aluminum, stainless steel, or other suitable material.

In one configuration, baghouse mechanical force transfer structure 217 may be moved through compression mechanism port 274 via magnetic actuator comprising (1) an inner slide 220 made from a ferromagnetic material (i.e., iron, etc.) coupled to baghouse mechanical force transfer structure 217 inside baghouse compression mechanism housing 218, and (2) yoke 222 comprising a set of strong, permanent magnets positioned outside compression mechanism housing 218 and further magnetically coupled to an inner slide 220. In one configuration, yoke 222 is comprised of rare-earth magnets comprising lanthanides (e.g., neodymium, samarium-cobalt, etc.).

For example, in a typical operating configuration in which a vacuum of about 1 Torr to about 30 Torr is maintained at vacuum port 246, a magnetic actuator configured with 5 lbs of linear force and 60 oz-in of rotary force is sufficient to compress and rotate baghouse 205 in order to substantially clear particle clumps 216a from fabric 226a.

Furthermore, inert gas may be used to purge various subcomponents of particle collection apparatus. For example, in order to remove collected particles, collection apparatus 236 must be decoupled from baghouse housing 206. Consequently, in order to minimize ambient contamination, an inert gas (e.g., nitrogen, etc.) 238 is generally injected into collection apparatus 236. Initially, collection apparatus 236 is isolated by closing isolation valve 232 and valve 233. Inert gas valve 237 is then opened allowing inert gas 238 to flow into collection apparatus 236. Inert valve 234 and isolation valve 234 are then closed, allowing collection apparatus 236 to be removed.

In addition, an inert gas may be used to help dislodge particles from baghouse 305 when compressed. Initially, isolation valve 204, isolation valve 245, and isolation valve 248 are closed. Next, inert gas valve 244 is opened, allowing inert gas 242 to flow into baghouse 305 and expel particles that have caked on fabric 226a.

FIG. 3B shows the set of porous cylinders (comprising outer cylinder 370 and inner cylinder 372) that is configured inside baghouse 305 as shown in FIG. 3A. Outer cylinder 370 is comprised of a substantially stiff porous and inert material 380, such as Teflon, with a outer cylinder pore diameter of about 1/16 in to about 3/16 in. A first end of outer cylinder 370 is generally attached to circular cross-section cap 328, which itself is coupled to baghouse mechanical force transfer structure 217 through compression mechanism port 274, as previously described.

A second end of outer cylinder 370 is open and configured to slide over inner cylinder 372, which itself provides structural support to outer cylinder 370 during low vacuum operating conditions.

Inner cylinder 372 is also comprised of a substantially stiff porous and inert material 378, such as Teflon, with an inner cylinder pore diameter of about 1/16 in to about 3/16 in. In addition, unlike outer cylinder 370, inner cylinder 372 is configured with a set of ring support structures 376 comprised of a structurally strong yet inert material, such as Teflon. A first end of inner cylinder 372 is generally attached to circular cross-section cap 382, which itself is coupled to vacuum port 246. A second end of inner cylinder 372 is open and configured to slide into outer cylinder 370.

FIG. 3C shows the particle collection apparatus of FIG. 3A in which the baghouse cylindrical lateral expansion structure is substantially compressed and optionally twisted. In an advantageous manner, baghouse 305 may be compressed and optionally twisted in a clockwise or counter-clockwise manner in order to substantially remove caked nucleated particles from a crumpled fabric 326b. In addition, as previously described, inert gas 242 may be used to help dislodge particles from baghouse 305.

Figure 4:
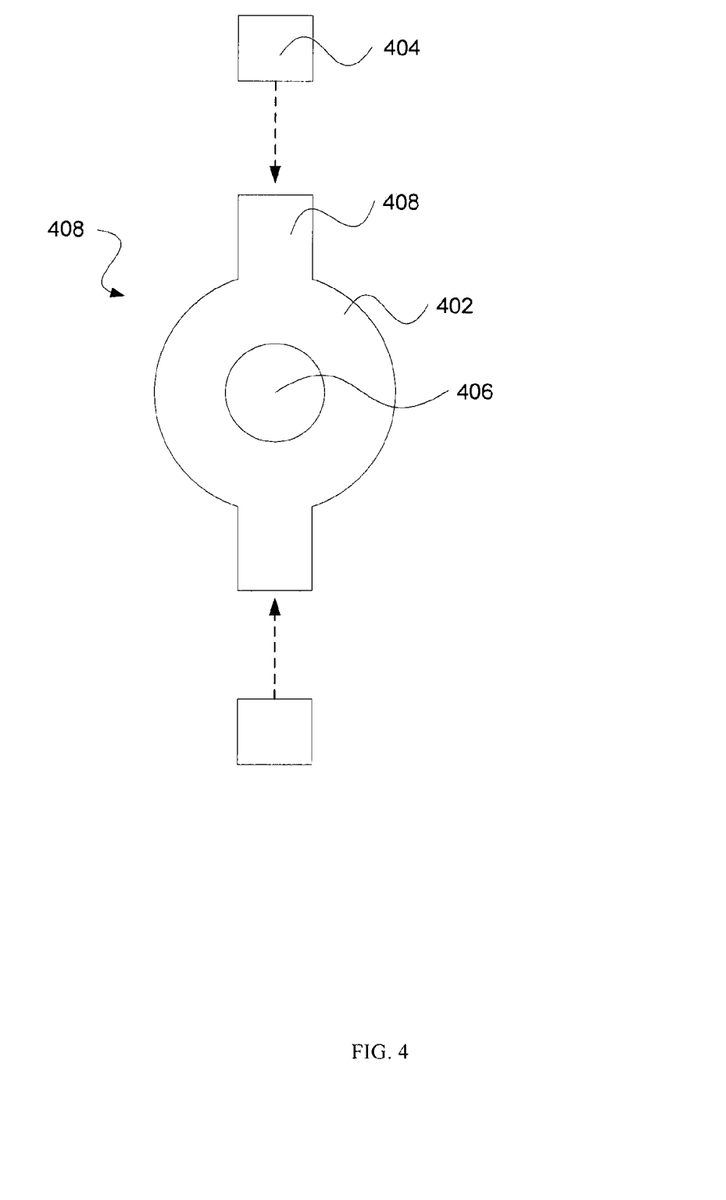
FIG. 4 shows a simplified diagram of a magnetic actuator is shown, in accordance with the invention.

Referring now to FIG. 4, a simplified diagram of a magnetic actuator is shown, in accordance with the invention. Inner slide 408 is generally composed of cylinder barrel 402 which is configured to transfer a linear force from yoke 404 via a set of inner slide flanges 408 to a mechanical force transfer structure (not shown) that is coupled to cylinder barrel 402 through cavity 406. Additionally, magnetically coupled to the set of inner slide flanges 408 is generally a yokes 404 comprising a set of strong, permanent magnets. In a common configuration, the magnetic actuator is configured to accept a linear force of about 200 lbs, a maximum load of about 65 lbs., a torque of about 350 ox-in., and a straightness of motion of 0.006 per 12" of travel.

Figure 5A:
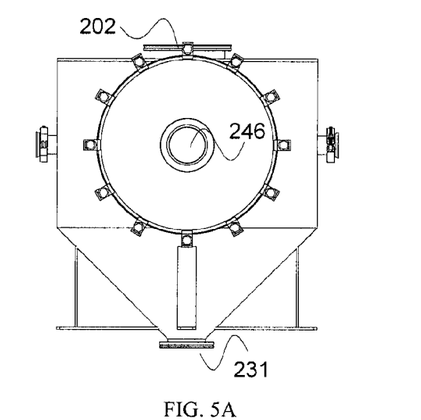
FIGS. 5A-F show a simplified set of diagrams of the particle collection apparatus, in accordance with the invention.
Figure 5B:
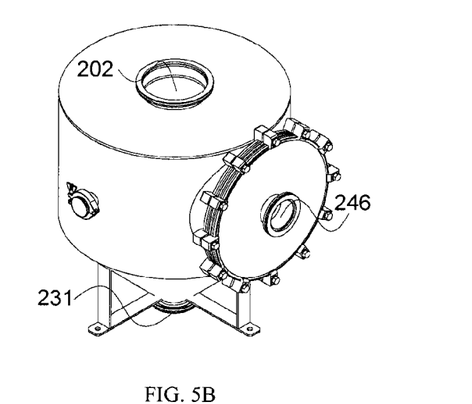

Referring now to FIG. 5A-F, a simplified set of diagrams of the particle collection apparatus is shown, in accordance with the invention. FIG. 5A is an external side view of particle collection apparatus in which entrance port 202, vacuum port 246, and collection port 231 is shown. FIG. 5B is an external isometric view of particle collection apparatus in which entrance port 202, vacuum port 246, and collection port 231 are shown.

Figure 5C:
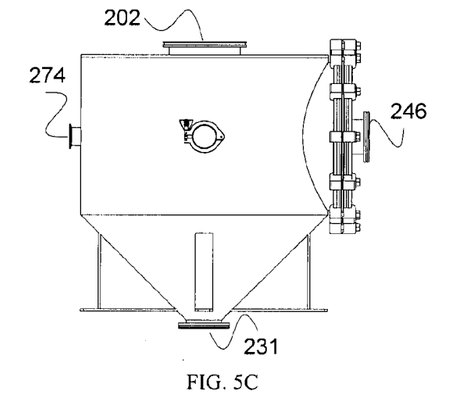
Figure 5D:
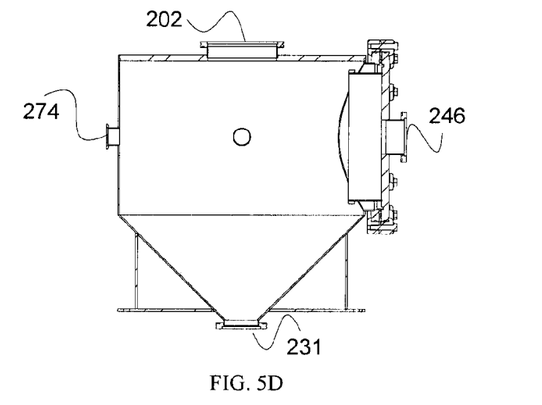
Figure 5E:
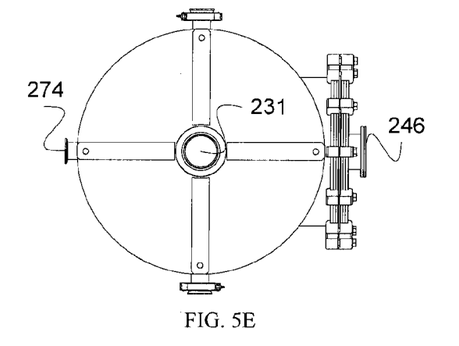

FIGS. 5C-D is an external side view of particle collection apparatus in which compression mechanism port 274, entrance port 202, vacuum port 246, and collection port 231 are shown. FIG. 5E is a bottom view of particle collection apparatus in which collection port 231, compression mechanism port 274, and vacuum port 246.

Figure 5F:
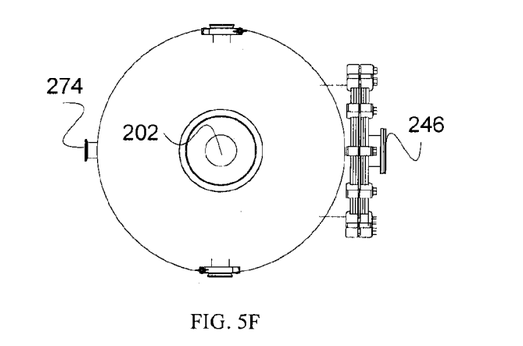

FIG. 5F is a top view of particle collection apparatus in which entrance port 202, compression mechanism port 274, and vacuum port 246.

In an advantageous manner, the longitudinal axis of a compressible baghouse is coupled to a vacuum pump and positioned in a substantially perpendicular manner to a generally heated particle effluent flow. As the vacuum pump removes gas molecules from the particle collection apparatus, and through the baghouse, a substantial portion of the particles tend to form (soft and hard) agglomerates in the effluent flow.

The inventions illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the invention claimed.

Thus, it should be understood that although the present invention has been specifically disclosed by preferred embodiments and optional features, modification, improvement and variation of the inventions herein disclosed may be resorted to by those skilled in the art, and that such modifications, improvements and variations are considered to be within the scope of this invention. The materials, methods, and examples provided here are representative of preferred embodiments, are exemplary, and are not intended as limitations on the scope of the invention.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above.

All publications, patent applications, issued patents, and other documents referred to in this specification are herein incorporated by reference as if each individual publication, patent application, issued patent, or other document were specifically and individually indicated to be incorporated by reference in its entirety. Definitions that are contained in text incorporated by reference are excluded to the extent that they contradict definitions in this disclosure.

For the purposes of this disclosure and unless otherwise specified, "a" or "an" means "one or more." All patents, applications, references and publications cited herein are incorporated by reference in their entirety to the same extent as if they were individually incorporated by reference. In addition, the word set refers to a collection of one or more items or objects.

Advantages of the invention methods and apparatus for the substantially continuous in situ collection of nucleated particles.

Having disclosed exemplary embodiments and the best mode, modifications and variations may be made to the disclosed embodiments while remaining within the subject and spirit of the invention as defined by the following claims.

What is claimed is:

1. A particle collection apparatus, comprising:
   (A) a baghouse housing comprising
      (i) an entrance port,
      (ii) a collection port,
      (iii) a baghouse, and
      (iv) a vacuum port;
   wherein (a) the baghouse housing is configured to process a particle flow through the entrance port directed to the collection port; (b) the baghouse is positioned inside the baghouse housing between the entrance port and the collection port in such a way an outer surface of the baghouse is exposed to the particle flow; and c) wherein the vacuum port is coupled to an inner volume of the baghouse to maintain a pressure differential in the baghouse housing so that particles of the particle flow are deposited on the outer surface of the baghouse due to the pressure differential;
   (B) a particle collection mechanism coupled to the collection port; and,
   (C) a compression mechanism, which is attached to the baghouse and is configured to compress and twist the baghouse.

2. The particle collection apparatus of claim 1, wherein the baghouse comprises a porous fabric cylinder,
a spring configured to keep the porous fabric cylinder substantially taut,
a circular cap positioned on a first end of the porous fabric cylinder, and
the vacuum port positioned on a second end of the porous fabric cylinder.

3. The particle collection apparatus of claim 2, wherein the compression mechanism comprises
a mechanical force transfer structure coupled to the circular cap,
an inner slide coupled to the mechanical force transfer structure,
a yoke magnetically coupled to the inner slide.

4. The particle collection apparatus of claim 3, wherein the mechanical force transfer structure is comprised of one of anodized aluminum and stainless steel.

5. The particle collection apparatus of claim 1, wherein the entrance port is coupled to a plasma reactor configured to produce the particle flow.

6. The particle collection apparatus of claim 1, wherein the vacuum port is coupled to a pump, the pump maintaining a vacuum of between about 1 Torr and about 30 Torr in the baghouse.

7. The particle collection apparatus of claim 1, further comprising an inert gas valve coupled to the vacuum port, wherein when the inert gas valve is opened, an inert gas flows into the baghouse.

8. The particle collection apparatus of claim 1, wherein the baghouse housing further comprises
a mesh screen configured between the entrance port and the baghouse,
a mesh scraper configured between the mesh screen and the entrance port, and
a mesh scraper compression mechanism coupled to the mesh scraper.

9. The particle collection apparatus of claim 8, wherein the mesh screen comprises Teflon.

10. The particle collection apparatus of claim 1, wherein the baghouse comprises
a porous fabric cylinder,
a lateral expansion structure configured to support the porous fabric cylinder,
a circular cap positioned on a first end of the porous fabric cylinder, and
the vacuum port positioned on a second end of the porous fabric cylinder.

11. The particle collection apparatus of claim 10, wherein the compression mechanism comprises
a mechanical force transfer structure coupled to the circular cap,
an inner slide coupled to the mechanical force transfer structure,
a yoke magnetically coupled to the inner slide.

12. The particle collection apparatus of claim 1, wherein a longitudinal axis of the baghouse is positioned substantially perpendicular to the particle flow.

* * * * *